(12) United States Patent
Papageorgiou et al.

(10) Patent No.: US 8,138,050 B2
(45) Date of Patent: Mar. 20, 2012

(54) TRANSISTOR DEVICE COMPRISING AN ASYMMETRIC EMBEDDED SEMICONDUCTOR ALLOY

(75) Inventors: Vassilios Papageorgiou, Dresden (DE); Jan Hoentschel, Dresden (DE); Robert Mulfinger, Dresden (DE); Casey Scott, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 162 days.

(21) Appl. No.: 12/555,879

(22) Filed: Sep. 9, 2009

(65) Prior Publication Data

US 2010/0081244 A1    Apr. 1, 2010

(30) Foreign Application Priority Data

Sep. 30, 2008 (DE) .......................... 10 2008 049 718

(51) Int. Cl.
*H01L 21/336* (2006.01)
(52) U.S. Cl. ................. 438/286; 438/300; 257/E21.431
(58) Field of Classification Search .................. 438/286, 438/429, 938
See application file for complete search history.

(56) References Cited

U.S. PATENT DOCUMENTS 7,892,928 B2 *  2/2011  Cheng et al. .................. 438/286
7,939,852 B2 *  5/2011  Pal et al. ....................... 257/190

FOREIGN PATENT DOCUMENTS

WO    WO 2006/039641 A2    4/2006

OTHER PUBLICATIONS

Translation of Official Communication from German Patent Office for German Patent Application No. 10 2008 049 718.5 dated Apr. 27, 2009.

* cited by examiner

*Primary Examiner* — Chandra Chaudhari
(74) *Attorney, Agent, or Firm* — Williams, Morgan & Amerson, P.C.

(57) ABSTRACT

Transistor characteristics may be adjusted on the basis of asymmetrically formed cavities in the drain and source areas so as to maintain a strain-inducing mechanism while at the same time providing the possibility of obtaining asymmetric configuration of the drain and source areas while avoiding highly complex implantation processes. For this purpose, the removal rate during a corresponding cavity etch process may be asymmetrically modified on the basis of a tilted ion implantation process.

23 Claims, 6 Drawing Sheets

TRANSISTOR DEVICE COMPRISING AN ASYMMETRIC EMBEDDED SEMICONDUCTOR ALLOY

BACKGROUND OF THE INVENTION

1. Field of the Invention

Generally, the present disclosure relates to integrated circuits, and, more particularly, to transistors having complex dopant profiles and including an embedded semiconductor alloy, such as a silicon/germanium alloy, for creating strain in the channel region.

2. Description of the Related Art

Integrated circuits comprise a large number of circuit elements on a given chip area according to a specified circuit layout, wherein transistors, such as field effect transistors, represent an important component that is used as switching element, current and/or voltage amplifier. The transistors are formed in and above substantially crystalline semiconductor regions with additional dopant materials that are formed at specified substrate locations to act as "active" regions, that is, to act, at least temporarily, as conductive areas for creating a controlled current flow. Generally, a plurality of process technologies are currently practiced, wherein, for complex circuitry, such as microprocessors, storage chips and the like, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A transistor, irrespective of whether an N-channel transistor or a P-channel transistor or any other transistor architecture is considered, comprises so-called PN junctions that are formed by an interface of highly doped regions, such as drain and source regions, with a lightly doped or non-doped region, such as a channel region, disposed adjacent to the highly doped regions. In the case of a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the conductivity of the channel region substantially affects the performance of the MOS transistors. Thus, the scaling of the channel length, and associated therewith the reduction of channel resistivity, renders the channel length a dominant design criterion for accomplishing an increase in the operating speed of the integrated circuits.

The continuing shrinkage of the transistor dimensions, however, entails a plurality of issues associated therewith that have to be addressed so as to not unduly offset the advantages obtained by steadily decreasing the dimensions of transistors. For example, highly sophisticated dopant profiles, in the vertical direction as well as in the lateral direction, are required in the drain and source regions to provide low sheet and contact resistivity in combination with a desired channel controllability in order to counter so-called short channel effects, such as drain-induced barrier lowering and the like. In addition, the vertical location of the PN junctions with respect to the gate insulation layer also represents a critical design criterion in view of leakage current control, as reducing the channel length also requires reducing the depth of the drain and source regions with respect to the interface formed by the gate insulation layer and the channel region, thereby calling for sophisticated implantation techniques.

Furthermore, since the continuous size reduction of the critical dimensions, e.g., the gate length of the transistors, necessitates the adaptation and possibly the new development of highly complex process techniques concerning the above-identified process steps, it has been proposed to also enhance device performance of the transistor elements by increasing the charge carrier mobility, for instance, in the channel region for a given channel length, thereby offering the potential for achieving a performance improvement that is comparable with the advance to a future technology node of down-sized devices while avoiding many of the above process adaptations associated with device scaling. In principle, at least two mechanisms may be used, in combination or separately, to increase the mobility of the charge carriers in the channel region. First, in field effect transistors, the dopant concentration within the channel region may be reduced, thereby reducing scattering events for the charge carriers and thus increasing the conductivity. However, reducing the dopant concentration in the channel region significantly affects the threshold voltage of the transistor device, thereby presently making a reduction of the dopant concentration a less attractive approach unless other mechanisms are developed so as to adjust a desired threshold voltage. Second, the lattice structure in respective semiconductor regions, such as the channel region, may be dilated/stretched, for instance by creating tensile or compressive strain therein, which results in a modified mobility for electrons and holes, respectively. For example, creating uniaxial tensile strain in the channel region of a field effect transistor with respect to the current flow direction increases the mobility of electrons, which in turn may directly translate into a corresponding increase in the conductivity. On the other hand, compressive strain in the channel region may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor, which may enable the fabrication of fast powerful semiconductor devices without requiring expensive semiconductor materials and manufacturing techniques.

Consequently, it has been proposed to introduce a silicon/germanium alloy in the drain and source regions of P-channel transistors to create compressive stress that may result in a corresponding strain.

With reference to FIGS. 1a-1b, typical conventional approaches will be described for enhancing performance of P-channel transistors with respect to reducing short channel effects, enhancing charge carrier mobility in the channel region and reducing overall series resistance of the drain/source path.

FIG. 1a schematically illustrates a cross-sectional view of a P-channel transistor 100 including a substrate 101, such as a silicon bulk substrate, and a silicon-on-insulator (SOI) substrate, i.e., a buried insulating layer (not shown), may be formed on the substrate 101. Furthermore, a semiconductor layer 102, such as a silicon layer, is formed above the substrate 101 and may include isolation structures 103, such as shallow trench isolations and the like. The isolation structures 103 may define an "active" region in and above which one or more transistor elements may be formed, such as the transistor 100. It should be appreciated that an active region is to be understood as a semiconductor region receiving or having formed therein appropriate dopant profiles so as to adjust the overall conductivity in accordance with device requirements, for instance, for achieving transistor characteristics and the like. In the manufacturing stage shown, a gate electrode structure 104 may be formed above the semi-conductor layer 102, wherein a gate insulation layer 104A of the gate electrode structure 104 separates the gate electrode material 104, such as polysilicon and the like, from a channel region 105 in the semiconductor layer 102. Moreover, as illustrated, the gate electrode 104 may have formed on sidewalls thereof a non-electrode material in the form of spacer elements 104B, such as silicon dioxide and the like. Furthermore, the gate electrode structure 104 is encapsulated by spacer elements 107 and a cap layer 108, which may, for instance, be comprised of silicon nitride. Furthermore, recesses or cavities 106 are formed in the semiconductor layer 102 laterally adjacent to and offset from the gate electrode structure 104, wherein a lateral offset is substantially determined by the width of the spacer elements 104B and the spacer 107.

A typical conventional process flow for forming the transistor 100 as shown in FIG. 1a may comprise the following processes. After forming the isolation structures 103, an appropriate vertical dopant profile within the semiconductor layer 102 may be defined by accordingly designed implantation processes. Thereafter, material layers for the gate electrode structure 104, i.e., a gate dielectric material and an electrode material, may be formed by appropriate techniques, such as thermal or wet chemical oxidation and/or deposition for the gate dielectric, while, frequently, low pressure chemical vapor deposition (LPCVD) may be used for depositing polysilicon as a gate electrode material. Moreover, further material layers, such as material for the cap layer 108, which may act as a portion of an anti-reflective coating (ARC), may also be deposited in accordance with well-established process recipes. The resulting layer stack may then be patterned by advanced photolithography and etch techniques, followed by the formation of the spacer 104B, for instance by thermal oxidation, deposition and the like. Next, a spacer material may be deposited, for instance in combination with a liner material, if required, which may then be patterned by well-established anisotropic etch techniques to obtain the spacer elements 107, the width of which may substantially determine the lateral offset of the cavities 106.

As previously explained, uniaxial compressive strain in the channel region 105 in the current flow direction may significantly enhance the mobility of holes, thereby enhancing overall performance of the transistor 100 when representing a P-channel transistor. In order to provide the desired compressive strain, the cavities 106 may be formed by well-established etch techniques using the spacers 107 and the cap layer 108 as an etch mask, wherein, in the example shown, the isolation structures 103 may also act as an etch mask. In other cases, an additional hard mask layer may be provided if the lateral extension of the cavities 106 is to be restricted so as to not entirely extend to the isolation structures 103. During the corresponding etch process, a certain amount of template material of the layer 102 may also be maintained if an SOI configuration is considered, in which a buried insulating layer may be positioned between the substrate 101 and the semiconductor layer 102. The cavities 106 may be refilled with an appropriate semiconductor material, such as silicon/germanium alloy, which has a natural lattice constant that is greater than the lattice constant of silicon, so that the corresponding epitaxially grown material may be formed in a strained state, thereby also exerting stress to the channel region 105 and thus creating a respective compressive strain therein. Selective epitaxial growth techniques for depositing silicon/germanium alloy materials are well established in the art and may be performed on the basis of appropriately selected process parameters, such as temperature, pressure, flow rate of precursor gases and carrier gases in such a manner that a significant deposition of material is substantially restricted to the crystalline silicon surfaces, while a deposition on dielectric materials may be suppressed. Moreover, during the deposition of the silicon/germanium material, a desired dopant species may also be incorporated into the deposition atmosphere, such as boron, in order to obtain a desired base doping for drain and source regions, depending on the required complexity of the vertical and lateral profile of the drain and source regions. Generally, a reduced series resistance of the drain and source regions may be achieved by providing high dopant concentrations, while, on the other hand, for highly scaled semiconductor devices, the corresponding electric field generated across the channel region 105 may result in increased charge carrier injection into the gate insulation layer 104A at high dopant concentrations, thereby typically requiring a reduced dopant concentration and a shallow profile of the drain and source regions in the vicinity of the gate electrode structure 104.

FIG. 1b schematically illustrates the transistor 100 in a further advanced manufacturing stage, in which the silicon/germanium alloy 109 may be formed in the cavities 106, as explained above, and wherein the spacers 107 and the cap layer 108 may be removed to expose the gate electrode structure 104. It should be appreciated that the spacers 104B may also be removed and may be replaced by appropriately designed offset spacers, if desired. As explained above, upon reducing the transistor dimensions, i.e., the gate length of the transistor 100, which is to be understood as the horizontal dimension of the gate electrode structure 104 in FIG. 1b, controllability of the channel region 105 may become increasingly difficult due to the short channel effects which, in some conventional approaches, may be countered in part by providing counter-doped regions 110, which may also be referred to as halo regions, in which the dopant concentration of the channel region 105 and the remaining semiconductor region, also referred to as the body region 102A, is significantly increased, thereby adjusting the dopant gradient at corresponding PN junctions to be formed by providing shallow doped drain and source regions. Typically, the counter-doped regions or halo regions 110 may be formed by ion implantation, for instance using a tilt angle, in order to establish a certain degree of overlap with the gate electrode structure 104. However, upon further scaling the transistor dimensions, the dopant concentration and thus implantation dose may also have to be increased, thereby also increasing dopant-induced charge carrier scattering, dopant diffusion and, due to the high dose implantation processes involved, stress relaxation in the vicinity of the channel region 105. Furthermore, a dopant concentration in the drain and source regions is generally increased in order to obtain a reduced series resistance of the drain and source regions, while not limiting device performance, dose and energy for the implantation process for creating the halo regions 110 also has to be increased. This in turn may further increase stress relaxation in the silicon/germanium alloy due to increased lattice damage and higher dopant diffusion. During the sophisticated implantation processes, longer treatment times may be required to obtain the desired high dose during the creation of the halo regions 110. Thus, although the silicon/germanium material 109 may be provided with high intrinsic dopant concentration, nevertheless, sophisticated and long implantation processes may be required for adjusting the PN junctions in the vicinity of the gate electrode structure 104 on the basis of the halo regions 110.

For these reasons and due to the fact that overall charge carrier mobility may also be increased by restricting dopant species only at locations, where required, it has also been proposed to provide asymmetric halo regions, which may be accomplished by using a non-zero tilt angle during the corresponding halo implantations in an asymmetric manner or by substantially completely avoiding the incorporation of a counter dopant species in one of the drain and source regions, for instance in the drain region, so as to further enhance overall transistor performance while avoiding some of the above-identified problems. However, using asymmetric transistor configurations on the basis of asymmetric halo implantation regions may require even further sophisticated implantation techniques, which may frequently not be compatible with other device and process requirements. Furthermore, further layout constraints may have to be respected, for instance by appropriately orienting the transistor devices so as to allow the corresponding sophisticated tilted implantation processes for obtaining the desired complex asymmetric profiles. Consequently, high efforts in terms of redesigning integrated circuits and providing corresponding process capabilities with respect to sophisticated implantation processes may be required in order to further enhance overall transistor performance. Other techniques used with respect to further enhancing transistor performance, such as generally increasing the channel doping concentration, may result in degradation of carrier mobility due to increased charge carrier scattering, thereby rendering these concepts less desirable in view of further device performance enhancement.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure relates to methods and semiconductor devices in which complex vertical and lateral drain and source configurations may be established by using selective epitaxial growth techniques in combination with asymmetrically provided cavities. That is, corresponding cavities may be formed in the drain and source areas with different lateral width and/or depth to provide enhanced flexibility in designing the corresponding drain and source regions with respect to enhancing overall transistor performance. For this purpose, the strain-inducing mechanism and/or the positioning of in situ incorporated dopant species may be provided in an asymmetric manner on the basis of the epitaxial growth process, thereby, for instance, providing the possibility of maintaining a high strain component at specific transistor areas, while nevertheless positioning a dopant species at a required location without creating significant lattice damage, since sophisticated long-term implantation processes may be reduced. The asymmetric configuration of the corresponding cavity may be accomplished, according to some illustrative aspects disclosed herein, by an asymmetric modification of the etch rate of the corresponding semiconductor material without requiring any masking regimes with a "spatial resolution" beyond transistor size. Consequently, a corresponding asymmetric transistor configuration may be obtained on the basis of well-established process strategies wherein, however, extremely sophisticated implantation processes, for instance sophisticated tilted halo implantations and the like, may be reduced for one type of transistors, thereby significantly contributing to overall performance enhancement.

One illustrative method disclosed herein comprises forming a first cavity in a semiconductor region having formed thereon a gate electrode structure, wherein the first cavity is located laterally adjacent to a first sidewall of the gate electrode structure. The method further comprises forming a second cavity in the semiconductor region laterally adjacent to a second sidewall of the gate electrode structure, wherein the first and second sidewalls are positioned oppositely to each other and wherein the first and second cavities differ in their depth and/or width. Moreover, the method comprises forming a semiconductor alloy in the first and second cavities, wherein the semiconductor alloy induces strain in a channel region positioned in the semiconductor region below the gate electrode structure.

A further illustrative method disclosed herein relates to forming an embedded semiconductor material in a transistor. The method comprises introducing an implantation species into a semiconductor region by performing a tilted implantation process, wherein the semiconductor region has formed thereon a gate electrode structure. Additionally, the method comprises forming a first cavity and a second cavity in the semiconductor region in a common etch process by using the implantation species as an etch control species, wherein the first and second cavities are positioned on opposite sides of the gate electrode structure and differ in at least one of depth and width. Finally, the method comprises forming a semiconductor material in the first and second cavities.

One illustrative semiconductor device disclosed herein comprises a gate electrode structure formed above a channel region. Furthermore, drain and source regions are formed laterally adjacent to the channel region. Additionally, the semiconductor device comprises a semiconductor alloy formed at least partially in the drain and source regions, wherein the semiconductor alloy formed in the drain region differs from the semiconductor alloy formed in the source region in at least one of a depth and a width.

BRIEF DESCRIPTION OF THE DRAWINGS

The disclosure may be understood by reference to the following description taken in conjunction with the accompanying drawings, in which like reference numerals identify like elements, and in which.

Figure 1A:
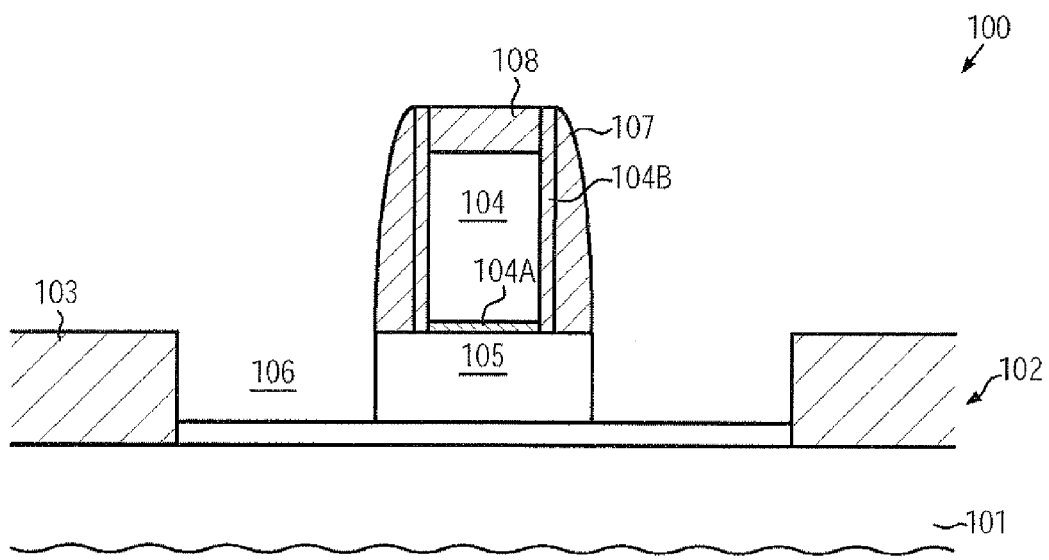
FIGS. 1a-1b schematically illustrate cross-sectional views of a conventional P-channel transistor during various manufacturing stages in providing an embedded silicon/germanium material in combination with a sophisticated dopant profile.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices and methods in which drain and source regions of transistor elements may be formed by using selective epitaxial growth techniques on the basis of asymmetric cavities, thereby providing enhanced flexibility in designing advanced transistor elements on the basis of less sophisticated implantation processes, as is previously described. By providing asymmetric cavities, an appropriate semiconductor material, such as a strain-inducing semiconductor alloy, may be positioned to provide a highly efficient strain-inducing mechanism while at the same time enabling the positioning of dopant species at dedicated locations by providing the epitaxially grown semiconductor material in the form of an in situ doped material. In other cases, the asymmetric configuration of the epitaxially grown semiconductor material may be used in combination with additional implantation techniques to provide a desired complex dopant profile, wherein, however, less demanding process limitations may have to be fulfilled since, for instance, at least some of the implantation process may be omitted, thereby reducing implantation-induced damage, as is also previously discussed. For example, a high dopant concentration may be positioned by means of the epitaxially grown semiconductor material, possibly in combination with a corresponding counter doping species, while corresponding extension regions, if required, may be formed on the basis of implantation techniques. Also in this case, the asymmetric configuration of the corresponding cavities may provide a per se enhanced transistor performance, while on the other hand additional mechanisms, such as strain-inducing mechanisms obtained by an appropriately selected semiconductor alloy, may still be accomplished.

The asymmetric configuration of the cavities may be obtained by utilizing well-established process techniques, such as an asymmetric modification of an etch rate of the basic semiconductor material so that the cavities may be formed at the opposite sides of the corresponding gate electrode structure in a common etch process while nevertheless providing the possibility of adjusting the degree of asymmetry with respect to a depth and/or a width of the corresponding cavities. For instance, in some illustrative embodiments disclosed herein, an appropriate implantation species may be implanted on the basis of a tilted implantation process, thereby using the gate electrode structure for shadowing a significant portion of one transistor side, thereby enabling an efficient adaptation of the etch rate of the semiconductor material. For example, with respect to a plurality of plasma-assisted etch recipes for selectively etching a silicon-based material, the incorporation of specific species, such as xenon, argon, fluorine and the like, may have pronounced effect on the removal rate, for instance a corresponding removal rate may be significantly reduced upon incorporation of the corresponding implantation species, thereby providing a desired imbalance between the semiconductor material exposed to the implantation process and the semiconductor region that is substantially shielded by the gate electrode structure. Consequently, by appropriately varying implantation parameters, a corresponding degree of asymmetry of the corresponding cavities may be obtained for a given etch recipe. Thus, the asymmetric cavities may be obtained without requiring sophisticated masking regimes that may require masking of transistor internal device regions so that respective well-established lithographical patterning regimes may be used in covering transistor areas in which a corresponding asymmetric configuration may not be required or in which respective cavities may not be necessary, while the transistor internal masking may be accomplished by selecting an appropriate tilt angle and using the gate electrode structure as an implantation mask.

In still other illustrative embodiments, an appropriate dopant species may be used as an etch control species, for instance by providing a specific dopant concentration to extend down to a specific depth or by centering a moderately high dopant concentration at a specified target depth, which may thus significantly slow down the etch rate of a wet chemical etch process. For example, tetra methyl ammonium hydroxide (TMAH) is an etchant that may efficiently etch silicon material, wherein a corresponding removal rate may be significantly reduced upon encountering N-doped silicon material, which may provide the possibility of efficiently controlling the etch process and thus obtaining at least a different depth for the corresponding cavities.

In still other illustrative embodiments, an asymmetric modification of the etch rate may also be used for removing material of the epitaxially grown semiconductor material in order to compensate for a difference in height, which may be generated during the epitaxial growth process. Thus, similar height levels may be obtained in the asymmetric configuration, if desired, without requiring sophisticated masking regimes, since also a tilted implantation process may be used for asymmetrically removing undesired semiconductor materials.

Figure 1B:
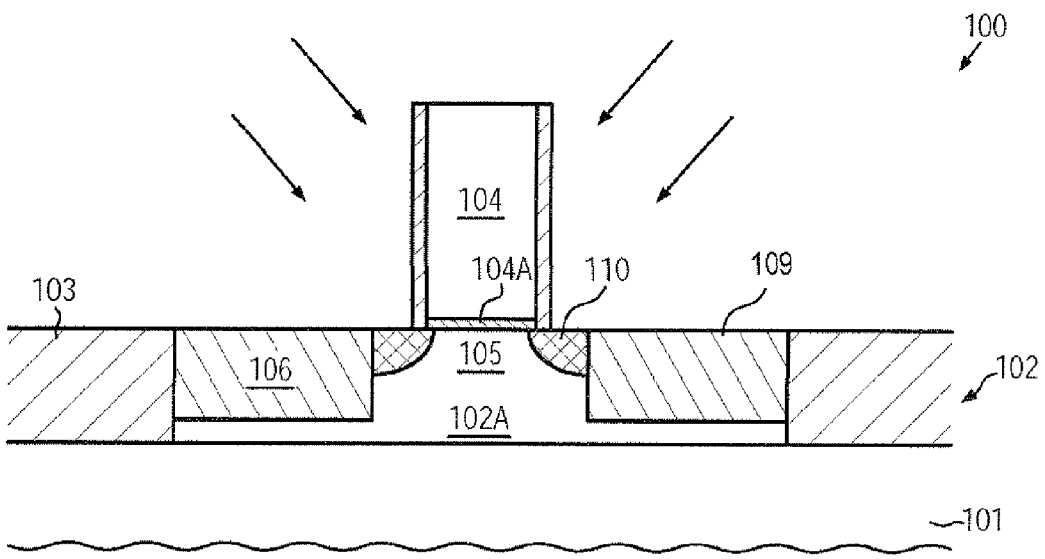

With reference to FIGS. 2a-2i, further illustrative embodiments will now be described in more detail, wherein reference may also be made to FIGS. 1a-1b, if appropriate.

Figure 2A:
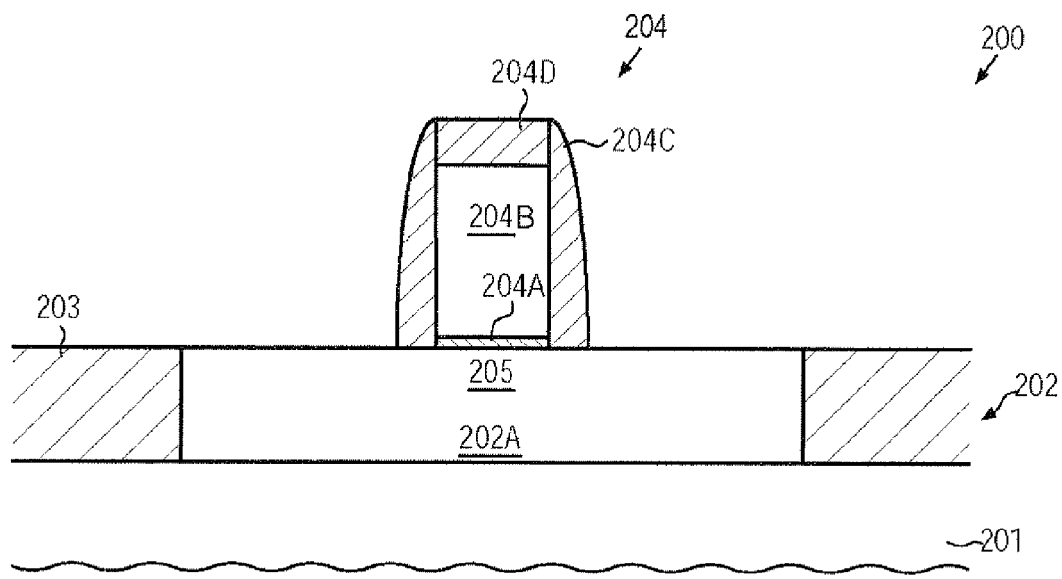
FIGS. 2a-2e schematically illustrate cross-sectional views of a transistor element during various manufacturing stages, in which asymmetric cavities may be used for forming a semiconductor material, such as a strain-inducing semiconductor alloy, according to illustrative embodiments.

FIG. 2a schematically illustrates a cross-sectional view of a semiconductor device 200 representing a transistor element for which an asymmetric configuration is to be provided on the basis of an epitaxially grown semiconductor material. The semiconductor device 200 may comprise a substrate 201 above which may be formed a semiconductor layer 202. It should be appreciated that the substrate 201 and the semiconductor layer 202 may represent an SOI configuration if a buried insulating layer (not shown) is positioned between the substrate 201 and the semiconductor layer 202. In other cases, the device 200 may represent a bulk configuration in which the semiconductor layer 202 may represent an upper portion of a substantially crystalline material of the substrate 201. Furthermore, isolation structures 203, such as trench isolations, are formed in the semiconductor layer 202 and define a semiconductor region 202A, which may also be referred to as an active region. Moreover, in the manufacturing stage shown, a gate electrode structure 204 is formed above the semiconductor region 202A and may comprise a gate electrode material 204B and a gate insulation layer 204A, which separates the electrode material 204B from a channel region 205 in the active region 202A. Furthermore, the gate electrode structure 204 may comprise a spacer structure 204C and a cap layer 204D, for instance comprised of silicon nitride or any other appropriate material for acting as an etch stop material and a growth mask during the further processing of the device 200.

The semiconductor device 200 as depicted in FIG. 2a may be formed on the basis of well-established process techniques, as are also described with reference to the device 100 shown in FIG. 1a. It should be appreciated that a semiconductor material, such as a strain-inducing semiconductor alloy, doped or non-doped, or any other semiconductor material in an in situ doped state, is to be embedded into the active region 202A at opposite sides of the gate electrode structure 204. The corresponding embedded semiconductor material is to be formed on the basis of respective cavities, which are to be provided in an asymmetric manner, as previously explained.

Figure 2B:
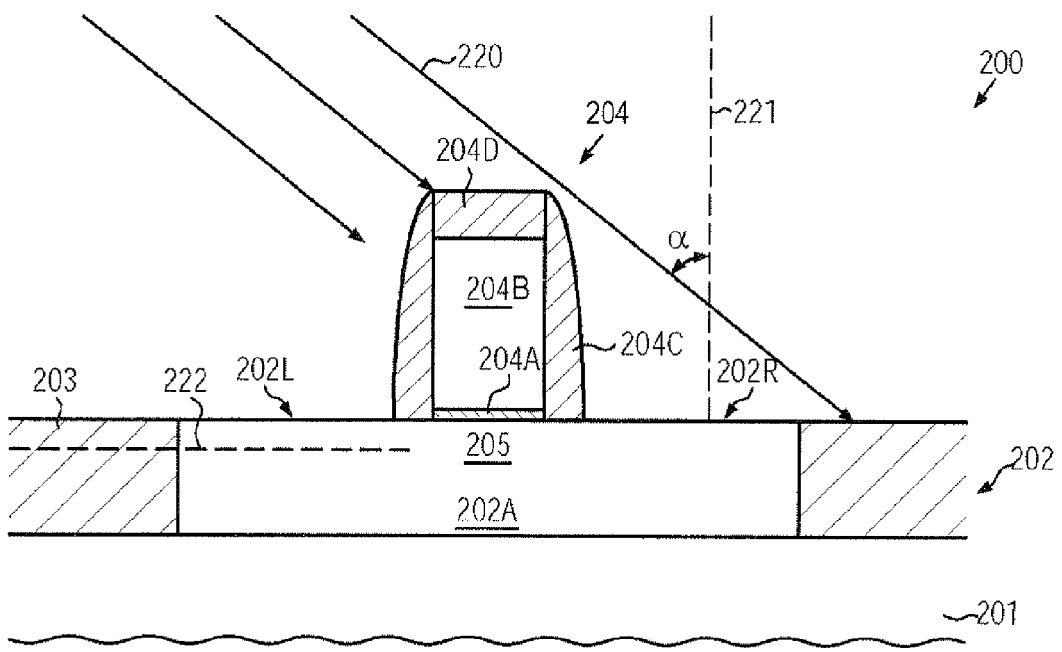

FIG. 2b schematically illustrates the semiconductor device 200 in a further advanced manufacturing stage, in which an etch behavior of material of the semiconductor region 202A may be modified in an asymmetric manner. In the embodiment shown, an ion implantation process 220 may be performed on the basis of a non-zero tilt angle α which is to be understood as an angle of the substantially parallel ion beam of the process 220 and a surface normal 221. Thus, in the embodiment shown, the left hand side of the semiconductor region 202A, indicated as 202L, may be exposed to the ion beam 220, while a right hand side, indicated as 202R, may be significantly shielded by the gate electrode structure 204, depending on the selected tilt angle α and the configuration of the gate electrode structure 204. For example, if a substantially complete shielding of the right hand side 202R is desired, the tilt angle α may be selected on the basis of the lateral extension of the active region 202A and the height of the gate electrode structure 204 including the cap layer 204D and a length of the gate electrode structure 204 including the spacer structure 204C. For instance, in sophisticated applications including gate electrode structures having a gate length of 50 nm and less at a gate height of 80-150 nm, a range of approximately 35-55 degrees may be appropriate for substantially completely shadowing the right hand side 202R for a moderately low implantation energy. It should be appreciated, however, that the tilt angle α may be varied so as to obtain a more complex profile of a corresponding implantation species 222, thereby also profiling the corresponding removal rate of material of the active region 202A. The implantation process 220 may be performed on the basis of any appropriate implantation species that may enable a specific variation of the etch behavior on material exposed to the beam 220. For example, in some illustrative embodiments, an inert species, i.e., a species that may substantially not change the electronic characteristics of the semiconductor material in the region 202A, may be introduced with an appropriate implantation energy and dose, in order to obtain the desired degree of modification of the etch rate. It should be appreciated that corresponding appropriate process parameters for the process 220 may readily be determined on the basis of test runs, in which the removal rate may be determined for a plurality of different implantation parameters and implantation species. For example, xenon, argon, fluorine and the like may be used during the implantation process 220, thereby obtaining a significant reduction in removal rate for the crystalline semiconductor material in the region 202A. Consequently, by providing a certain dose of the implantation species 222 down to a specified depth, a corresponding imbalance of the respective removal rates may be obtained for the sides 202L, 202R during a subsequent etch process. In other illustrative embodiments, a dopant species may be introduced to act as an etch control species, as will be described later on in more detail.

Figure 2C:
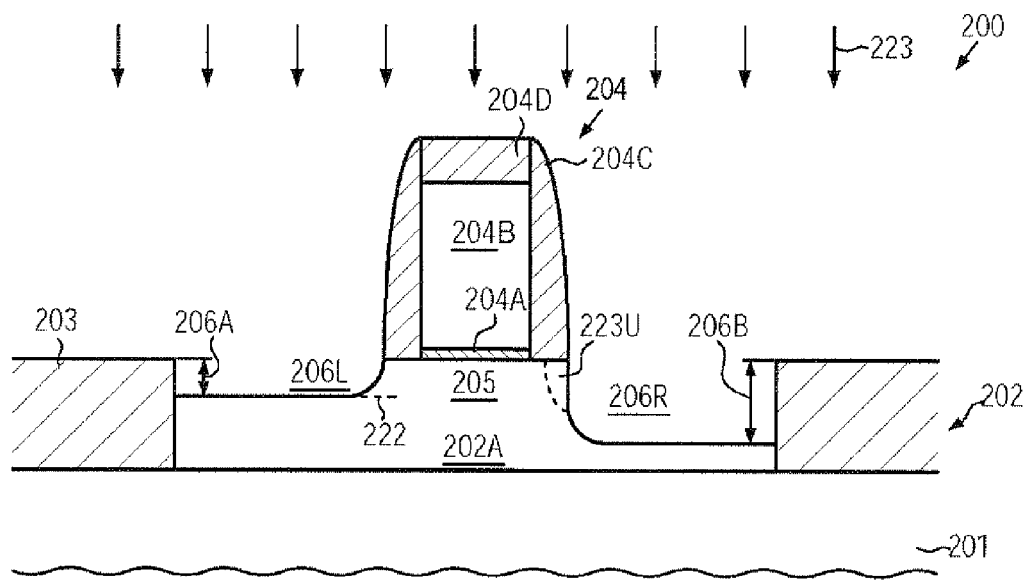

FIG. 2c schematically illustrates the semiconductor device 200 during a cavity etch process 223, which may be performed on the basis of a plasma assisted selective etch recipe, for instance for removing silicon material selectively to silicon dioxide, silicon nitride and the like. For this purpose, well-established process recipes are available, for instance using chloride-based etch chemistries and the like. Thus, during the etch process 223, a lateral offset of corresponding cavities 206L, 206R may be determined by the width of the spacer structure 204C and respective process parameters of the process 223, which may be selected so as to adjust a certain degree of anisotropy of the etch behavior. For example, if a certain degree of under-etching, as indicated by 223U, may be desired at the right hand side 206R to further reduce the offset of a strain-inducing semiconductor material that may be formed in the cavities 206L, 206R, a moderately low degree of anisotropy may be selected during the process 223, at least during an initial phase thereof, for instance by appropriately selecting the incorporation of respective polymer components, which may typically be added to adjust the directionality of a plasma assisted etch process. On the other hand, the previously incorporated implantation species 222 (FIG. 2b) may provide a corresponding reduced etch rate in the lateral direction, thereby maintaining a degree of under-etching significantly less compared to the right hand side 206R. In other cases, a substantially anisotropic etch behavior may be selected, wherein, also in this case, the implantation species 222 may provide a reduced etch rate so that a reduced depth 206A may be obtained in the left cavity 206L compared to a depth 206B of the cavity 206R. Consequently, the cavities 206L, 206R may differ in their depth 206A, 206B, respectively, and/or in a corresponding width, for instance by providing the under-etched area 223U. It should be appreciated that a ratio of the depth 206A, 206B may thus be readily established for a given etch recipe on the basis of the preceding implantation process 220 (FIG. 2b), thereby providing the possibility of appropriately adjusting characteristics of the transistor 200 in an asymmetric manner.

Figure 2D:
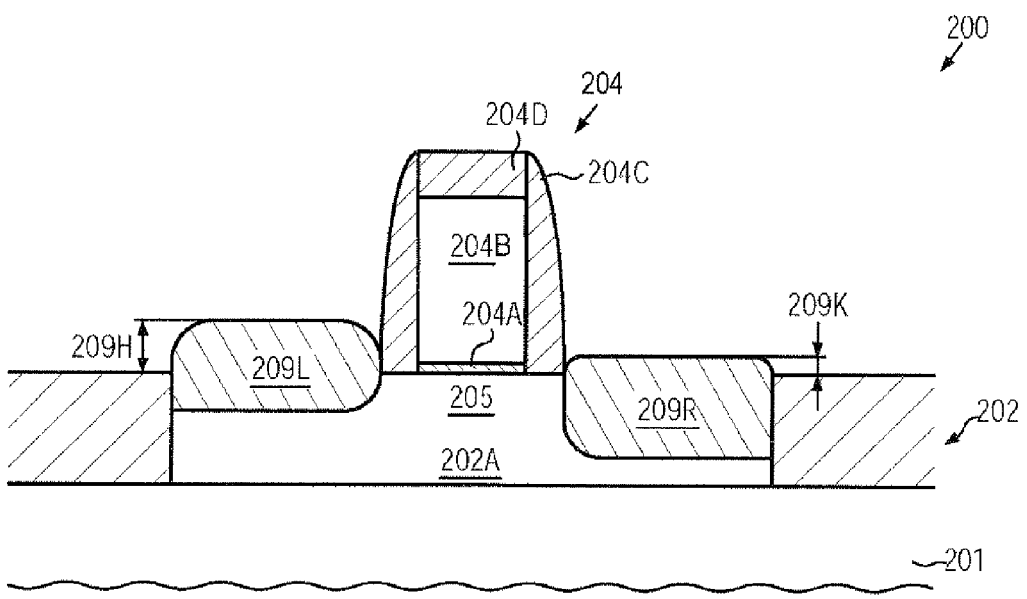

FIG. 2d schematically illustrates the semiconductor device 200 in a further advanced manufacturing stage. As illustrated, the semiconductor device 200 comprises a semiconductor material 209L, 209R formed in the corresponding cavities 206L, 206R (FIG. 2c). In some illustrative embodiments, the semiconductor material 209R, 209L may represent a strain-inducing semiconductor alloy, such as a silicon/germanium mixture, a silicon/germanium/tin mixture, a silicon/tin mixture, when a compressive strain component is desired in the channel region 205 and when the base material of the region 202A may be a silicon material. In other cases, a silicon/carbon alloy may be provided, for instance, when a corresponding tensile strain component is desired in the channel region 205. As previously explained with reference to the device 100, the semiconductor material 209R, 209L may be formed on the basis of well-established epitaxial growth techniques, wherein, if desired, one or more dopant species may be added to the deposition ambient in order to provide an "in situ" doped semiconductor material. For example, the semiconductor material 209L, 209R may include a high concentration of a P-type dopant species, if the transistor 200 represents a P-channel transistor, and the semiconductor material 209R, 209L may be provided to represent the corresponding drain and source regions of the transistor 200. In other cases, a corresponding counter doping species may be provided, at least in an initial phase of the epitaxial growth process, if considered appropriate. It should be appreciated that, prior to or after the deposition of the material 209R, 209L, other dopant species may be incorporated by ion implantation, such as drain and source extension regions and the like, as previously explained with reference to the device 100, wherein, however, significantly less restricting process parameters may be used, or wherein, for given implantation techniques and parameters, an overall gain in performance may be obtained by providing the asymmetric configuration on the basis of the cavities 206L, 206R (FIG. 2c). It should be appreciated that, in some illustrative embodiments, a different height level for the semiconductor materials 209R, 209L, as indicated by 209H, 209K, may not be considered as disadvantageous for the further processing of the transistor 200 and for the final performance thereof. In other cases, a corresponding balancing of the corresponding height levels 209H, 209K may be accomplished on the basis of process techniques, as will be described later on in more detail.

Figure 2E:
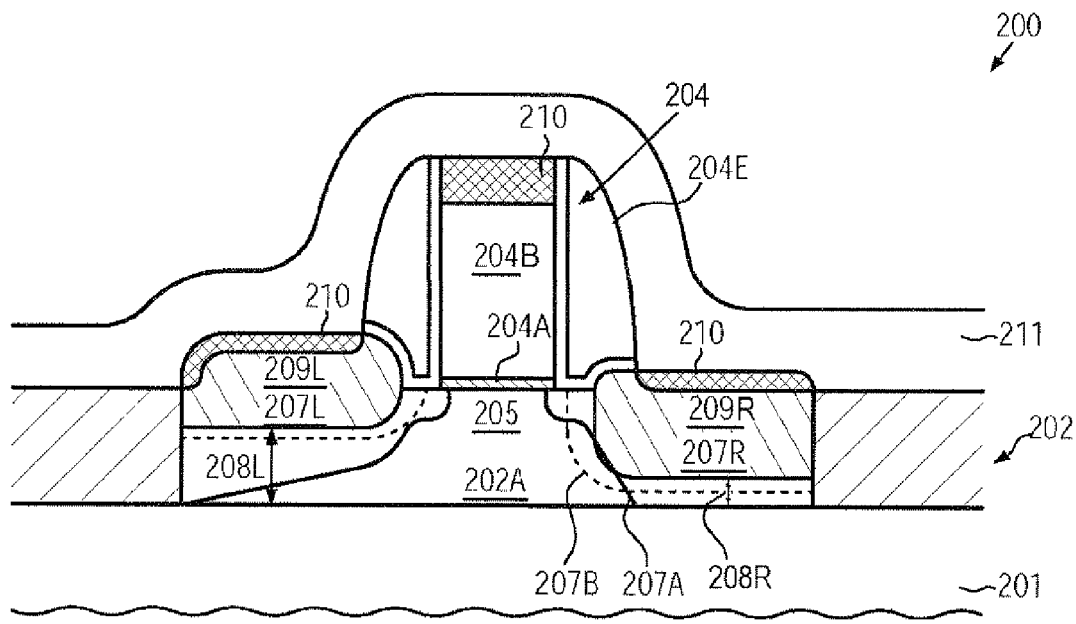

FIG. 2e schematically illustrates the transistor 200 in a further advanced manufacturing stage. As illustrated, the device 200 comprises drain and source regions 207R, 207L in an asymmetric manner, at least with respect to a depth 208R, 208L of the corresponding semiconductor material 209R, 209L, which may be positioned at least partially within the drain and source regions 207R, 207L. It should be appreciated that the terms source region and drain region may depend on the operational mode of the transistor 200 and, thus, depending on the overall device and process requirements, the region 207R may correspond to the drain or the source region and similarly the region 207L may correspond to the source or drain region. It should further be appreciated that the drain and source regions 207R, 207L may have any appropriate dopant profile, which may be formed on the basis of additional implantation processes if the in situ doping of the semiconductor material 209R, 209L may be considered inappropriate or a further "refinement" of the overall dopant profile may be required. For example, as indicated in an illustrative manner for the drain or source region 207R, various dopant profiles, such as indicated by 207A, 207B, may be obtained on the basis of additional implantation processes and/or any anneal techniques, for instance for initiating a certain degree of diffusion of dopants from the material 209R into the surrounding semiconductor material. Thus, even if additional process techniques for promoting out-diffusion and/or implanting further dopant species are used, a desired asymmetric configuration may be maintained and may be modified on the basis of less critical process techniques based on the asymmetrically positioned semiconductor material 209R, 209L. Furthermore, corresponding metal silicide regions 210 may be provided in the drain and source regions 209R, 209L and also in the gate electrode structure 204. Additionally, depending on the overall transistor configuration, a further sidewall spacer structure 204E may be formed on sidewalls of the gate electrode material 204B, as required for forming the metal silicide regions 210 and/or introducing further dopant species on the basis of ion implantation processes.

Thus, an asymmetric transistor configuration may be obtained wherein the semiconductor material 209R, 209L may be positioned asymmetrically in the drain and source regions, at least with respect to the different height levels 208R, 208L, thereby also providing a desired degree of asymmetric configuration of the corresponding dopant profiles so that, for instance, on the left hand side, dopant species may be positioned to extend to a lesser depth compared to the right hand side, while still maintaining a certain degree of strain in the vicinity of the channel region 205. On the other hand, at the right hand side, a significantly enhanced degree of strain may be generated by the material 209R, if provided as a strain-inducing semiconductor alloy, such as a silicon/germanium material and the like. Consequently, the transistor characteristics of the device 200 may be adjusted with an enhanced degree of flexibility with respect to the positioning of respective dopant species, while nevertheless maintaining an efficient strain-inducing mechanism and also providing a highly efficient overall process flow. Furthermore, as illustrated in FIG. 2e, a further strain-inducing mechanism may be provided by forming a strain-inducing layer 211 above the basic transistor configuration, which may be accomplished by depositing silicon nitride materials, nitrogen-containing silicon carbide materials and the like, depending on the type of internal stress level required. As is well known, silicon nitride may be deposited by plasma enhanced CVD techniques with high internal stress, that is, tensile stress or compressive stress, by appropriately selecting the deposition parameters. Similarly, nitrogen-containing silicon carbide material may be deposited with high internal compressive stress, thereby also enabling performance enhancement of P-channel transistors.

The transistor 200 as shown in FIG. 2e may be formed on the basis of well-established process techniques wherein the finally desired dopant profile in the drain and source regions 207R, 207L may be adjusted by ion implantation processes, if required, anneal processes and the like, as previously explained, wherein the spacer structure 204E may act as an implantation mask. Thereafter, the metal silicide regions 210 may be formed according to well-established techniques, followed by the deposition of the stressed dielectric material 211, which may also involve the deposition of any etch stop material or etch control material, if required.

Figure 2F:
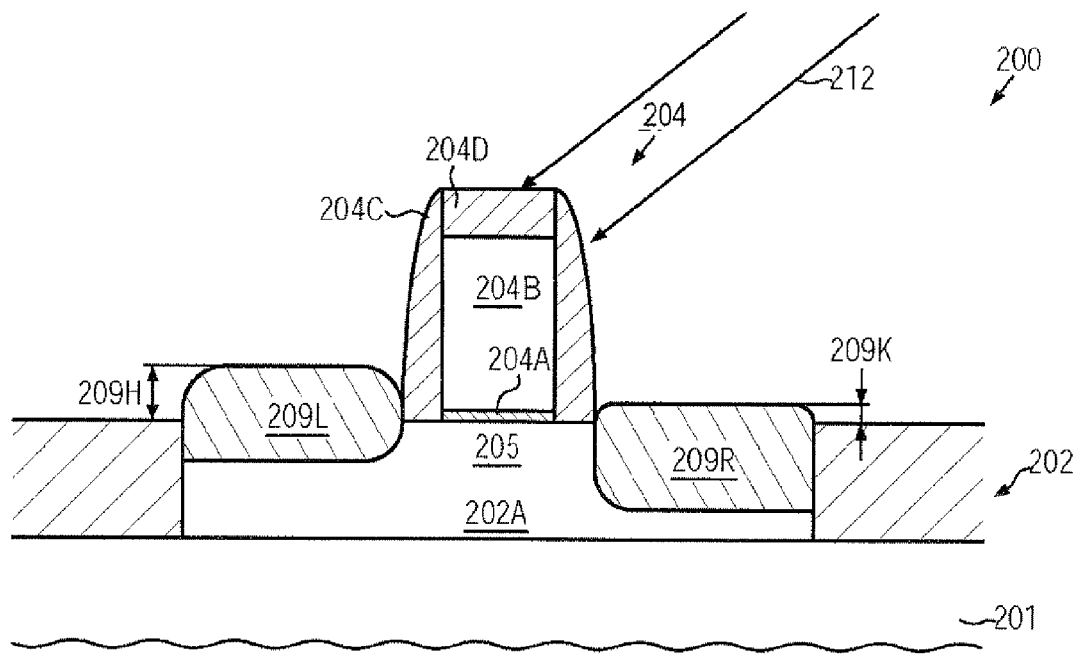
FIGS. 2f-2g schematically illustrate cross-sectional views of a transistor element during an asymmetric removal of epitaxially grown semiconductor material, according to still further illustrative embodiments.

FIG. 2f schematically illustrates the semiconductor device 200 according to further illustrative embodiments in which a difference in the height levels 209K, 209H after the selective epitaxial growth process may be reduced. For this purpose, a tilted implantation process 212 may be performed to introduce a specific implantation species, such as an inert species, as is also previously explained with reference to the implantation process 220. In this case, a surface portion of the material 209R may receive the inert species, thereby modifying the corresponding etch behavior, as previously explained, while the material 209L may be substantially shielded by the gate electrode structure 204.

Figure 2G:
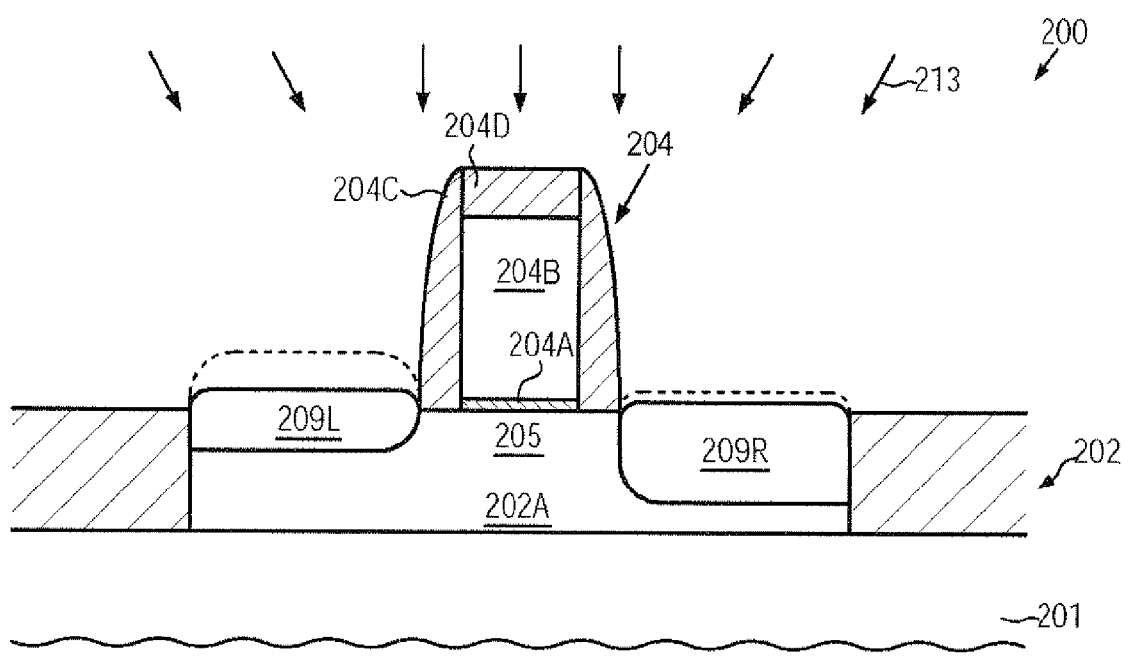

FIG. 2g schematically illustrates the semiconductor device 200 when exposed to an etch ambient 213 designed to remove material from the regions 209R, 209L, however, at different etch rates. For example, similar process techniques may be used, as previously described with reference to the etch process 223. For instance, a plasma assisted etch recipe may be used in which the incorporation of the inert species and the corresponding material modification may result in a significantly reduced etch rate in the region 209R. On the other hand, a moderately high etch rate may be obtained in the region 209L, as indicated by the dashed lines. Furthermore, in other illustrative embodiments, in a final phase of the selective epitaxial growth process for forming the materials 209R, 209L, a substantially non-doped semiconductor material, such as a silicon/germanium material and the like, may be deposited and, during the preceding tilted implantation process 212, an N-type dopant species may be incorporated into the region 209R, thereby also providing enhanced etch stop capabilities of N-type silicon with respect to a wet chemical etch chemistry on the basis of TMAH, as is also previously explained. Hence, also in this case, a corresponding asymmetric etch behavior may be obtained during the process 213, when performed as a wet chemical etch step.

Thereafter, the further processing may be continued as required, for instance by removing the sidewall spacer structure 20C and introducing dopant species by an ion implantation process, if required, for instance for forming drain and source extension regions, wherein the reduced difference in height level between the regions 209R, 209L may result in more uniform conditions in both regions, if desired. Thus, by reducing the difference in height level, the further processing may be performed on the basis of substantially "symmetric" conditions for the drain and source regions, if desired, while nevertheless a certain degree of asymmetry may be obtained due to the different vertical positions of the regions 209R, 209R and the corresponding dopant species provided therein, if the materials 209R, 209L are provided as in situ doped semiconductor materials. Thereafter, any further manufacturing processes may be performed, as is also previously described with reference to FIG. 2e.

Figure 2H:
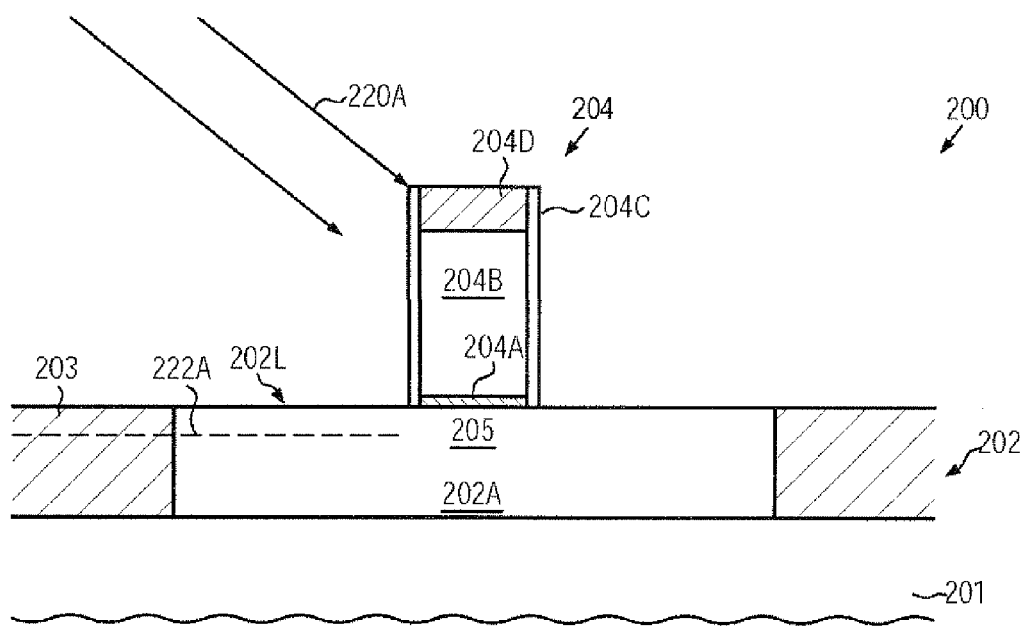
FIGS. 2h-2i schematically illustrate cross-sectional views of a transistor element during corresponding manufacturing stages in forming asymmetric cavities on the basis of a wet chemical etch process in combination with a dopant species acting as an etch control species, according to yet other illustrative embodiments.

FIG. 2h schematically illustrates the semiconductor device 200 according to further illustrative embodiments. As illustrated, the device 200 is exposed to a tilted ion implantation process 220A, which may be designed to introduce an N-type dopant species selectively at the left hand side 202L. Furthermore, the gate electrode structure 204 may have formed thereon the sidewall spacers 204C in the form of a silicon dioxide material, with a desired thickness such as one to several nanometers, depending on the overall device requirements.

Figure 2I:
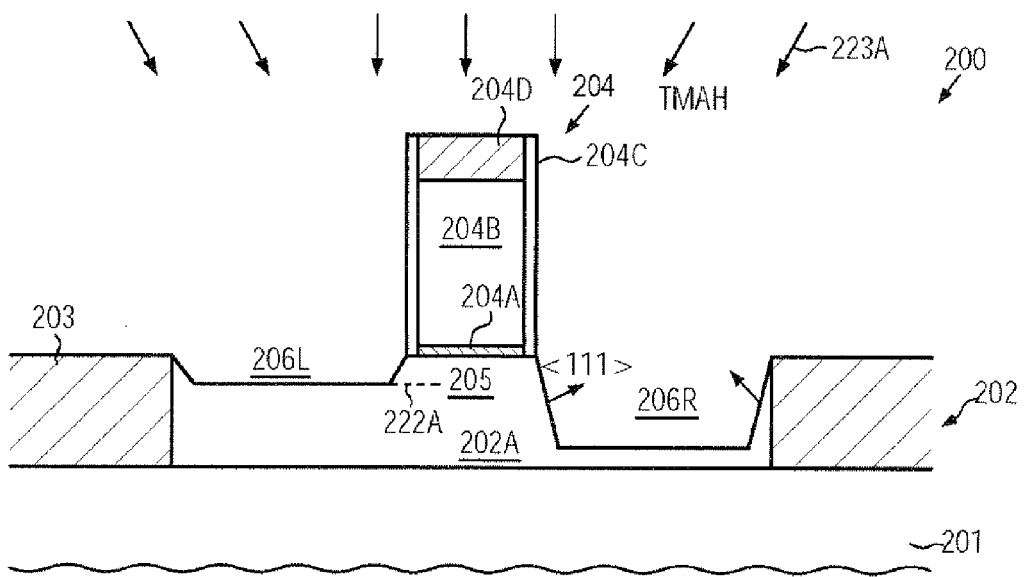

FIG. 2i schematically illustrates the semiconductor device 200 during a wet chemical etch process 223A, which is performed on the basis of an appropriate etch chemistry that provides a crystallographically anisotropic etch behavior. As is well known, certain wet chemical etch chemistries may exhibit a different etch rate along different crystallographic directions so that corresponding crystal planes associated with a corresponding direction of reduced etch rate may provide precise and controllable restriction of the corresponding advance of the etch front. In one illustrative embodiment, the wet chemical etch process 223A may be performed on the basis of TMAH, which may have a significantly reduced removal rate in silicon material with respect to the <111> direction so that, for a standard crystallographic orientation of the silicon region 202A, that is, a (100) surface orientation, and the gate electrode structure 204 oriented with its length direction, i.e., in FIG. 2i, the horizontal direction, along a <110> direction, (111) crystal planes may provide lateral restriction of corresponding cavities 206R, 206L. Furthermore, TMAH has a high etch selectivity with respect to silicon dioxide and thus even a very thin silicon dioxide material may provide sufficient etch stop capabilities, thereby enabling a reduced offset of the cavities 206R, at least at the upper portion thereof, with respect to the gate electrode material 204B. On the other hand, the removal rate of TMAH is significantly reduced in N-doped silicon material, so that the species 223A may efficiently slow down the etch process at the left hand side 206L, thereby providing the asymmetric cavities 206R, 206L. After the etch process 223A, the further processing may be continued, as is described above, to complete the basic transistor configuration.

As a result, the present disclosure provides techniques and semiconductor devices in which a semiconductor material, such as a strain-inducing semiconductor alloy, doped or non-doped, may be provided in an asymmetric manner by forming asymmetric cavities at opposite sides of a gate electrode structure of a transistor. That is, the resulting asymmetric cavities may differ from each other in depth and/or width so that a corresponding asymmetric adaptation of transistor characteristics may be accomplished, for instance providing in situ doped material in an asymmetric manner, while nevertheless providing the possibility of maintaining an efficient strain-inducing mechanism, at least in the vicinity of the channel region. The asymmetric configuration of the transistor may be obtained by a tilted implantation process to appropriately modify the etch behavior of the basic semiconductor material, thereby avoiding any sophisticated masking techniques. In some illustrative embodiments, a difference in height level of the epitaxially grown semiconductor material, such as strain-inducing semiconductor alloys, may be reduced on the basis of a subsequent asymmetric etch process, thereby obtaining an even further increased degree of flexibility in adjusting the overall transistor characteristics. For instance, silicon/germanium material, silicon/germanium/tin material, silicon/tin material and the like may be incorporated into asymmetrically provided cavities to appropriately adjust performance of P-channel transistors. In other cases, a silicon/carbon material may be incorporated into asymmetrically provided cavities in order to enhance performance of N-channel transistors. Consequently, by asymmetrically configured cavities for embedding an epitaxially grown semiconductor material, transistor performance may be enhanced without requiring complex implantation techniques or designs of circuit layouts with respect to gate electrode orientation and the like.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a first cavity in a semiconductor region having formed thereon a gate electrode structure, said first cavity located laterally adjacent to a first sidewall of said gate electrode structure;
   forming a second cavity in said semiconductor region laterally adjacent to a second sidewall of said gate electrode structure, said first and second sidewalls being positioned oppositely to each other, said first and second cavities differing in at least one of a depth and a width;
   forming a semiconductor alloy in said first and second cavities, said semiconductor alloy inducing strain in a channel region positioned in said semiconductor region below said gate electrode structure; and
   removing a portion of said semiconductor alloy adjacent to one of said first sidewall and said second sidewall.

2. The method of claim 1, wherein forming said first and second cavities comprises asymmetrically modifying an etch behavior of material of said semiconductor region so as to have an increased removal rate at one of said first and second sidewalls.

3. The method of claim 2, wherein asymmetrically modifying an etch behavior of material of said semiconductor region comprises performing an ion implantation process using a non-zero tilt angle.

4. The method of claim 3, wherein said ion implantation process is performed on the basis of an inert implantation species.

5. The method of claim 4, wherein said inert implantation species comprises at least one of xenon, argon and fluorine.

6. The method of claim 3, wherein said ion implantation process is performed on the basis of a dopant species.

7. The method of claim 6, wherein said dopant species is an N type dopant species.

8. The method of claim 1, wherein said first and second cavities are commonly formed by performing a plasma assisted etch process.

9. The method of claim 6, wherein said first and second cavities are commonly formed by performing a wet chemical etch process using said dopant species as an etch control species.

10. The method of claim 1, wherein removing said portion of said semiconductor alloy comprises performing an ion implantation process to introduce an implantation species in the semiconductor alloy adjacent to one of said first and second sidewalls and performing an etch process using said implantation species as an etch control species.

11. A method of forming an embedded semiconductor material in a transistor, the method comprising:
    introducing an implantation species into a semiconductor region by performing a tilted implantation process, wherein said semiconductor region has formed thereon a gate electrode structure comprising first and second sidewalls, and wherein a dose of said implantation species in said semiconductor region is higher adjacent to said first sidewall than adjacent to said second sidewall;
    forming a first cavity and a second cavity in said semiconductor region in a common etch process by using said implantation species as an etch control species, wherein said first and second cavities are positioned on opposite sides of said gate electrode structure and adjacent to said first and second sidewalls, respectively, and wherein a depth of said first cavity is less than a depth of said second cavity; and
    forming a semiconductor material in said first and second cavities.

12. The method of claim 11, wherein said semiconductor material induces a strain in a channel region of said transistor.

13. The method of claim 12, wherein said semiconductor material comprises a dopant species so as to provide an asymmetric dopant profile.

14. The method of claim 11, wherein said implantation species comprises a dopant species.

15. The method of claim 14, wherein said common etch process comprises performing a wet chemical etch process.

16. The method of claim 15, wherein said wet chemical etch process is performed on the basis of tetra methyl ammonium hydroxide (TMAH).

17. The method of claim 11, further comprising removing material of said semiconductor material so as to reduce a height difference between a first portion of said semiconductor material formed in said first cavity and a second portion of said semiconductor material formed in said second cavity.

18. The method of claim 17, wherein removing material of said semiconductor material comprises performing a further tilted ion implantation process to asymmetrically introduce an etch control species into said semiconductor material.

19. A method, comprising:
    forming a gate electrode structure above an active region of a semiconductor device, said active region have a first area portion of a first side of said gate electrode structure and a second area portion on a second side of said gate electrode structure;
    modifying an etch behavior of material comprising said active region in said first area portion only;
    forming a first cavity having a first depth and a first width in said first area portion;
    forming a second cavity having a second depth and a second width in said second area portion, wherein said first and second cavities are formed during a common etch process, and wherein at least one of said first depth and said first width is different than at least a respective one of said second depth and said second width; and
    forming a semiconductor alloy in said first and second cavities, wherein said semiconductor alloy is adapted to induce a strain in a channel region positioned in said active region below said gate electrode structure.

20. The method of claim 19, wherein modifying an etch behavior of said material comprising said active region in said first area portion only comprises performing a tilted ion implantation process to implant an etch control species in said first area portion and using said gate electrode structure as an ion implantation mask.

21. The method of claim 20, wherein performing said tilted ion implantation process comprises implanting a dopant species.

22. The method of claim 19, wherein forming said semiconductor alloy in said first and second cavities comprises performing a common epitaxial growth process.

23. The method of claim 19, further comprising removing a portion of said semiconductor material from at least one of said first and second cavities.

* * * * *